(12) United States Patent
Benjamin

(10) Patent No.: US 6,972,579 B2
(45) Date of Patent: *Dec. 6, 2005

(54) WAFER INTEGRATED PLASMA PROBE ASSEMBLY ARRAY

(75) Inventor: Neil Benjamin, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/899,590

(22) Filed: Jul. 26, 2004

(65) Prior Publication Data

US 2004/0263190 A1    Dec. 30, 2004

Related U.S. Application Data

(60) Continuation of application No. 10/680,791, filed on Oct. 6, 2003, now Pat. No. 6,781,393, which is a division of application No. 09/540,418, filed on Mar. 31, 2000, now Pat. No. 6,653,852.

(51) Int. Cl.$^7$ ............................................. G01R 31/02
(52) U.S. Cl. ...................................... 324/754; 324/761
(58) Field of Search ............................... 324/754–762, 324/73.1, 158.1, 71.1; 439/482, 824; 438/14, 438/16–18; 73/866.5

(56) References Cited

U.S. PATENT DOCUMENTS

| | | | |
|---|---|---|---|
| 4,006,404 A | 2/1977 | Szuszczewicz et al. | ........ 324/33 |
| 4,697,143 A | 9/1987 | Lockwood et al. | ...... 324/158 P |
| 5,070,297 A | 12/1991 | Kwon et al. | ............. 324/158 P |
| 5,339,039 A | 8/1994 | Carlile et al. | ................ 324/655 |
| 5,359,282 A | 10/1994 | Teii et al. | .................... 324/71.1 |
| 5,565,681 A | 10/1996 | Loewenhardt et al. | ...... 250/305 |
| 5,576,630 A | 11/1996 | Fujita | ......................... 324/760 |
| 5,653,811 A | 8/1997 | Chan | ....................... 118/723 I |
| 5,705,931 A | 1/1998 | Klick | ........................ 324/464 |
| 5,801,386 A | 9/1998 | Todorov et al. | ............ 250/397 |
| 5,808,312 A | 9/1998 | Fukuda | .................... 250/492.2 |
| 5,851,842 A | 12/1998 | Katsumata et al. | ............ 439/9 |
| 5,936,413 A | 8/1999 | Booth et al. | ................ 324/678 |
| 6,357,308 B1 * | 3/2002 | Marsh et al. | .............. 73/866.5 |
| 6,653,852 B1 * | 11/2003 | Benjamin | .................... 324/754 |

OTHER PUBLICATIONS

W. Lukaszek et al., "Quantifying Wafer Charging During Via Etch", May 1996, 1$^{st}$ International Symposium on Plasma Process-Induced Damage.

R. Patrick et al.m "Study of Pattern Dependent Charging in a High-Density, Inductively Coupled Metal Etcher" May 1997, 2$^{nd}$ International Symposium on Plasma Process-Induced Damage.

(Continued)

Primary Examiner—Vinh P. Nguyen
(74) Attorney, Agent, or Firm—Martine Penilla & Gencarella, LLP

(57) ABSTRACT

A wafer integrated plasma diagnostic apparatus for semiconductor wafer processing system having a multiplicity of plasma probe assemblies arranged on a wafer in a planar array fashion such that one plasma probe assembly is in the center and eight more plasma probe assemblies are at intermediate positions such that they lie along the radius from the center to the corners; such corners forming four corners of a square box near the edge of the wafer. At each location and in each of the plasma probe assemblies, there are six possible probe elements having a relative geometrical area such that they are capable of making simultaneous measurements of both spatial resolution and real time measurement of different plasma characteristics at the wafer surface, such as: D.C. potential, A.C. potential, shading induced potentials, ion fluxes, ion energy distribution, and the electron part of the I-V Langmuir probe characteristic.

20 Claims, 7 Drawing Sheets

OTHER PUBLICATIONS

W. Lukaszek et al., "*Device Effects and Charging Damage: Correlations Between SPIDER-MEM and CHARM®-2*", May 1994, 4$^{th}$ International Symposium on Plasma Process-Induced Damage.

M. Current et al., "*Charging Effects in Ion Implantation: Measurements and Models*", May 1996, 1$^{st}$ International Symposium on Plasma Process-Induced Damage pp. 202-205.

W. Lukaszek, "*Understanding and Controlling Wafer Charging Damage*", Jun. 1998, Solid State Technology pp. 101-112.

M.C. Vella et al., "*Plasma Model for Charging Damage*", 1995, Nuclear Instruments and Methods in Physics Research B 96 (1995) pp. 48-51.

V. Singh et al., "*Modeling and Experimental Studies of a Transformer Coupled Plasma (TCP™) Source Design for Large Area Plasma Processing*", Feb. 1996, IEEE Transactions on Plasma Science. vol. 24, No. 1, pp. 133-134.

W. Collison et al., "*Conceptual Design of Advanced Inductively Coupled Plasma Etching Tools Using Computer Modeling*", Feb. 1996, IEEE Transactions on Plasma Science. vol. 24, No. 1, p. 135.

W. Collison et al., "*Studies of the low-pressure inductively-coupled plasma etching for a larger area wafer using plasma modeling and Langmuir probe*", pp. 100-107, Jan./Feb. 1998, J. Vac. Sci. Technol. A 16(1), American Vacuum Society.

* cited by examiner

WAFER INTEGRATED PLASMA PROBE ASSEMBLY ARRAY

CROSS REFERENCE TO RELATED APPLICATIONS

This application is a continuation application claiming 35 U.S.C. § 120 priority from parent U.S. patent application Ser. No. 10/680,791, filed Oct. 6, 2003 now U.S. Pat. No. 6,781,393, entitled "METHODS RELATING TO WAFER INTEGRATED PLASMA PROBE ASSEMBLY ARRAYS," which parent Application is herein incorporated by reference. The parent Application is a Divisional application which claimed 35 U.S.C. § 120 priority from its parent U.S. patent application Ser. No. 09/540,418, filed Mar. 31, 2000, entitled "WAFER INTEGRATED PLASMA PROBE ASSEMBLY ARRAY," issued Nov. 11, 2003, as U.S. Pat. No. 6,653,852, which patent is herein incorporated by reference.

FIELD OF THE INVENTION

The present invention relates generally to plasma diagnostic apparatuses for semiconductor wafer processing systems. More particularly, the present invention relates to a wafer integrated plasma probe assembly array.

BACKGROUND OF THE INVENTION

In the semiconductor industry, plasma, generally comprising of partially ionized gas is employed in etching and deposition processes whereby films are etched from or deposited onto wafer surfaces. In these processes, plasma can be characterized in terms of characteristics of the interaction between the surface to be processed and the plasma which is important in order to control the etch or deposition rate and consequently, the desired dimension of the etch depth or deposited film. These characteristics include the rate of flow of charged particles impinging upon the surface to be processed, the potential distribution of the plasma, the ion current flux, the electron temperature and density, and the ion energy.

In plasma etching systems, knowledge of the potential distribution of the plasma is useful because the energy with which particles impinge upon the surface to be processed depends upon the potential distribution. In addition, the plasma potential determines the energy with which ions strike other surfaces in the chamber. High-energy bombardment of these surfaces can cause sputtering and consequent re-deposition of the sputtered material upon the surface to be processed. In addition, process uniformity is related to the uniformity of the plasma.

Similarly, the ion current flux is an important characteristic of the plasma generated within a reaction chamber of a semiconductor wafer processing system. This characteristic generally defines the effectiveness of the semiconductor wafer processing system. Specifically, the ion current flux affects the uniformity of the etch process and indicates potential damage to a wafer. The measurement of ion current at various locations within the chamber is therefore important to characterize the effectiveness of the plasma in processing a wafer.

It is thus desirable to diagnose instantaneously from outside the processing chamber the various characteristics of the interaction between the surface to be processed and the plasma. Prior art FIG. 1A is an illustration showing a conventional wafer 1 having probe structures 2 formed thereon. The conventional wafer 1 consists of a Si wafer with the probe structures 2 fabricated using three levels of masks such as substrate contact, metal pad and oxide layer. The wafer 1 is processed using conventional wafer manufacturing techniques.

Prior art FIG. 1B shows the probe structures 2 under greater detail. The probe structure 2 includes a semiconductor substrate layer 4, which is on the semiconductor wafer 1 on which are comb-like structures 6 made from metals such as Cu or aluminum and with or without layers of insulators such as oxide layers 8. In the fabrication of semiconductor IC's where advanced MOS devices require multiple levels of metal interconnections, the size of the comb-like structures is such that the height of the structure could be less than 0.5 micron and the space between the structures could be less than 0.4 micron wide such that the aspect ratio could be greater than two. The aspect ratio is defined as the height of the comb-like structure divided by the width of the space between the comb-like structures of prior art FIG. 1B. The presence of tall structures on the substrate of a semiconductor wafer sometimes causes a differential charging of the surface due to the difference in electron and ion currents crossing the plasma sheath to the closely spaced structures.

The differential charging of the surface (prior art FIG. 1C) is mostly indicative of a non-uniform plasma which includes fluctuations in the electron and ion densities, and also indicates differences in surface potentials and charge flux densities. If plasma is non-uniform it is anticipated that the depth of etching or the depth of deposition would be variant across the surface of the wafer. Differential charging also could cause oxide damage in semiconductor devices due to differences in charge flux densities. This is very important as plasma is in contact with smooth and not so smooth surfaces on the wafer.

It is a purpose of the plasma diagnostics to ensure that the plasma is uniform across the wafer surface so that the different processes taking place in the plasma chamber would result in high yield for the device output.

Prior art FIG. 1C is an illustration showing a probe structure 2 on a conventional wafer 1. As shown in prior art FIG. 1C, the presence of probe structures causes shaded regions 10 where there is charge accumulation and unshaded regions 12 where there is no charge accumulation. The sign of the charge depends on the surface potential of the structure. Local inequality of positive and negative charge fluxes reaching the wafer surface results in a net charge. Local charge-flux imbalances result in circulating currents through the wafer that generate charging damage in gate oxides as in IC process equipment.

This calls for application of sufficient RF power for better gap fill capability. If the plasma is not uniform across the substrate, then the resulting current imbalance causes a voltage to build up in the substrate. This voltage allows the current from the plasma to flow in the substrate to the gate oxides of underlying MOS transistors. However, application of sufficient RF power could cause damage to the gate oxides leading to gate leakage or oxide breakdown when the amount of current exceeds the capacity of the gate oxide.

In general, there are two conventional methods of diagnosing the characteristics of interest, a probing method, and an electromagnetic wave method. In the probing method, the electrodes 204 usually made from metal (Prior art FIG. 2A) are on a support 206 are directly introduced into the plasma 202 to detect the electric current in the plasma which is then analyzed to determine the characteristics of the plasma. The probe is also called the Langmuir probe 200. The characteristic curve 250 (Prior art FIG. 2B) is obtained by varying the voltage on the electrode and measuring the current when the probe or the electrode is placed in the plasma. The I-V curve 252 indicates that for a large negative value of the probe potential, all electrons are essentially repelled and only ions contribute to the current leading to an ion saturation current (Isat). This ion saturation current or Isat simply determines the electron density provided electron temperature can be determined. Conversely, Isat is also a product of electron charge, disk surface area and ion flow.

In the electromagnetic wave method, electromagnetic waves including microwaves and lasers interact with the plasma and the results of the interaction are detected. By way of example, a beam reflected from the plasma is detected by spectroscopy and analyzed.

The probing method is limited to probing plasma of relatively low temperature and density. For plasmas of electron density Ne on the order of $10^{14}$ cm$-3$ and above and electron temperature of a few tens of electron volts and above, the probing method is of limited use. The electromagnetic method suffers from being complex and expensive to manufacture.

In view of the prior art that has been done on Langmuir probes and probe structures that are also charge monitors, what is needed is a diagnostic tool capable of taking simultaneous measurements of plasma characteristics like uniformity, electron or ion flux densities, potentials and ion energy in real time across a wide area of the wafer surface while the wafer is inside of the plasma chamber.

SUMMARY OF THE INVENTION

A preferred embodiment of the present invention includes an array of electrical probes formed upon an upper surface of a semiconductor wafer. The array of electrical probes provides simultaneous measurement of plasma characteristics in real time across a wide area of the wafer surface. The plasma is diagnosed while in the process chamber to study characteristics of the plasma as it interacts with a wafer. The plasma may be tested, for example, for being homogenous in it's electron or ion flux density, potential and particle temperature.

The planar array of plasma probes or the planar plasma probe assembly array is connected to the connectors on the wafer through the conductive interconnects. The resultant assembly of probe assembly arrays, conductive interconnects and the connectors form a wafer Integrated planar plasma probe assembly array. The probe assemblies are preferably arranged in a pattern: one probe assembly in the center and four more probe assemblies at intermediate positions such that the four probe assemblies lie along the radius from the center to the corners; the corners being the four corners of a square box near the edge of the wafer. On the same wafer are located four optional plasma probe assemblies spaced from the existing probe assemblies such that they lie roughly in between the probe assembly at the center and probe assemblies at the corners of a square. Each probe has six possible probe elements. The probe elements are wafer integrated Langmuir probes. The probe elements are, however, made from low impedance N-type silicon and are exposed to the plasma unlike in prior art where the Langmuir probe elements are conductors.

The probe elements are clustered into an assembly such that four of the six probe elements are of intermediate size or medium size, shaped roughly like squares, and are charge monitors with patterning on them. The structures on the four medium sized probe elements have a non-zero aspect ratio. The four medium sized probe elements are suitable for patterning in different ways to diagnose potentials due to charge shading effects. The probe structures on the four medium sized square elements are rectangular comb-like structures, which don't necessarily have identical aspect ratio. An important aspect of having a range of aspect ratios for the probe elements is that it gives an idea in real time as to what aspect ratio would cause a wafer damage in real time. The presence of probe structures on probe elements determines charge accumulation from the difference in electron and ion currents as they cross the plasma sheath to reach the plasma structures on the wafer substrate. Such a differential electron or ion flux from non-uniform plasmas is responsible for causing charge induced damage in some semiconductor devices. The fifth probe element has an area equal to the four medium sized probe elements and has no patterning on it. An absence of patterning makes the probe a plain probe. The fifth probe element with no patterning is considered to have a zero aspect ratio. The fifth probe element is considered as a reference Langmuir probe and is exposed to the plasma for measurements of floating potential and saturated ion flux. The sixth probe element is a plain probe with no patterning on it. Again, an absence of patterning constitutes zero aspect ratio. The sixth probe element is capable of providing electron measurements. However, the sixth probe element is very much smaller than any probe element or exposed substrate for the reason that in order to perform electron measurements, the excess current could cause damage to the probe if the probe's area is bigger because the probes are essentially made of conductors. The sixth probe element is a novel addition to any of the prior art in plasma diagnostics as it allows electron measurements along with flux, potential and charging damage measurements performed simultaneously in real time.

While it is important that the geometrical areas of the probe elements be such that the probe elements form a probe assembly, it is not a requirement that areas of probe pads be the same for all the probes. The geometrical shapes of the probe elements are also not a critical requirement for the invention. In the invention, the area of the smallest probe pad is about 0.25 mm squared while the area of the medium sized probe elements having square pads is 25 square mm each.

The probe pads, the conductive interconnects and the connectors are all placed on an N-type silicon wafer. There is also a large area that is not used for any probing purposes and is exposed to the plasma. These vacant areas on the substrate are covered with a low impedance N-type silicon for the sole purpose of making an ohmic contact easy. The large area of the wafer substrate also acts a floating reference electrode. At the floating potential, the probe collects both the saturation-ion current as well as canceling electron current such that the net current through the probe is zero.

There are also four more optional plasma probe assemblies arranged in between the center probe assembly and the corner probe assemblies. The four intermediate plasma probe assemblies can be rotated with respect to the plasma probe assemblies located already at the center and at the corners of the wafer.

Connections from the probe assemblies on the substrate to connectors are made on wafer traces. By arranging the connector pads to conform to a standardized mass termination array it is relatively convenient to connect them using wire bonds to a flexible circuit jumper strip to get the signals off of the wafer and into external diagnostic circuitry which includes an analyzer. The analyzer measures the relative electron or ion potentials and current flows from the charge particle fluxes, energies and impressed voltages. The probe assemblies on the wafer surface measure the plasma charge densities and energies when the plasma comes in contact in the plasma processing chamber. The local grouping of probe array assemblies at nine places allows both spatial resolution and real time measurement of six quantities: DC potential, AC potential, shading induced potentials, ion fluxes, ion energy distribution, and the electron component of the I-V Langmuir probe characteristic simultaneously.

Such an arrangement of planar probe assembly arrays determines electron or ion flux densities, potentials and ion energy in real time across a wide area of the wafer surface while the wafer is inside of the plasma chamber. The probe assemblies on the wafer allows six different measurements on the wafer when the plasma is in the charge shaded region or when it is in the charge unshaded region.

In wafer processing, it is highly preferred that the deposition or etching induced by plasma be uniform because millions of devices get built on a single wafer. As there is need to manufacture more number of devices on a single large wafer to reduce costs, it is imperative that the process involved be as uniform as possible. The diagnostics from such semiconductor equipment should indicate the quality of plasma over a wider area in the semiconductor process chamber because that would ultimately determine the device quality.

For a fuller understanding of the nature and advantages of the present invention, references should be made to the following detailed description taken together with the accompanying figures.

BRIEF DESCRIPTION OF THE DRAWINGS

The invention, together with further advantages thereof, may best be understood by reference to the following description taken in conjunction with the accompanying drawings in which:

Prior Art FIGS. 1(A–C) is an illustration showing a prior art wafer having charge monitors or probe elements formed thereon and wafer structure having plasma shaded and unshaded regions;

Figure 2A:
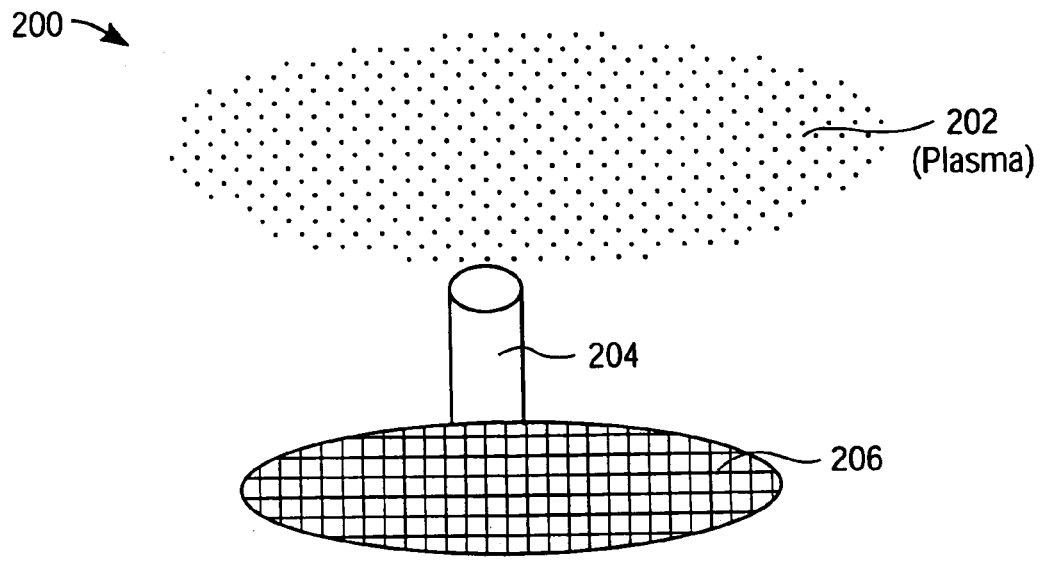
Figure 3:
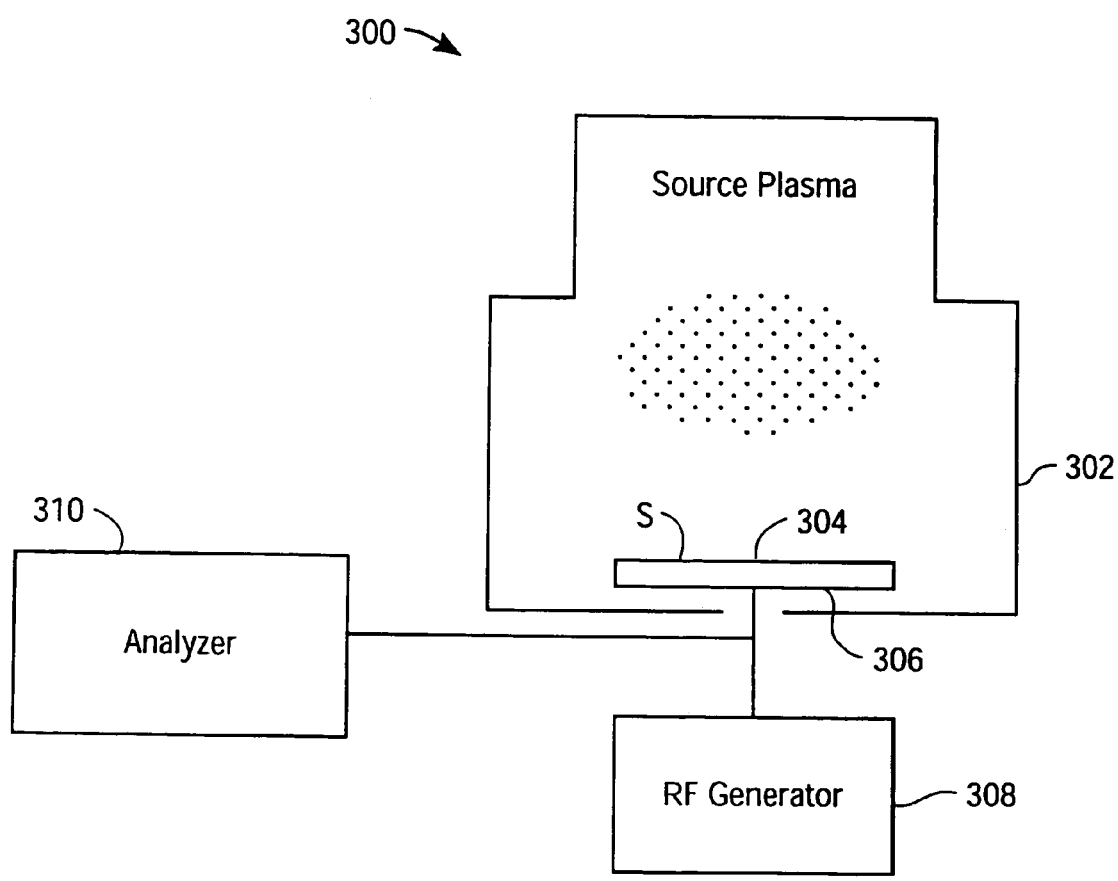
Figure 4:
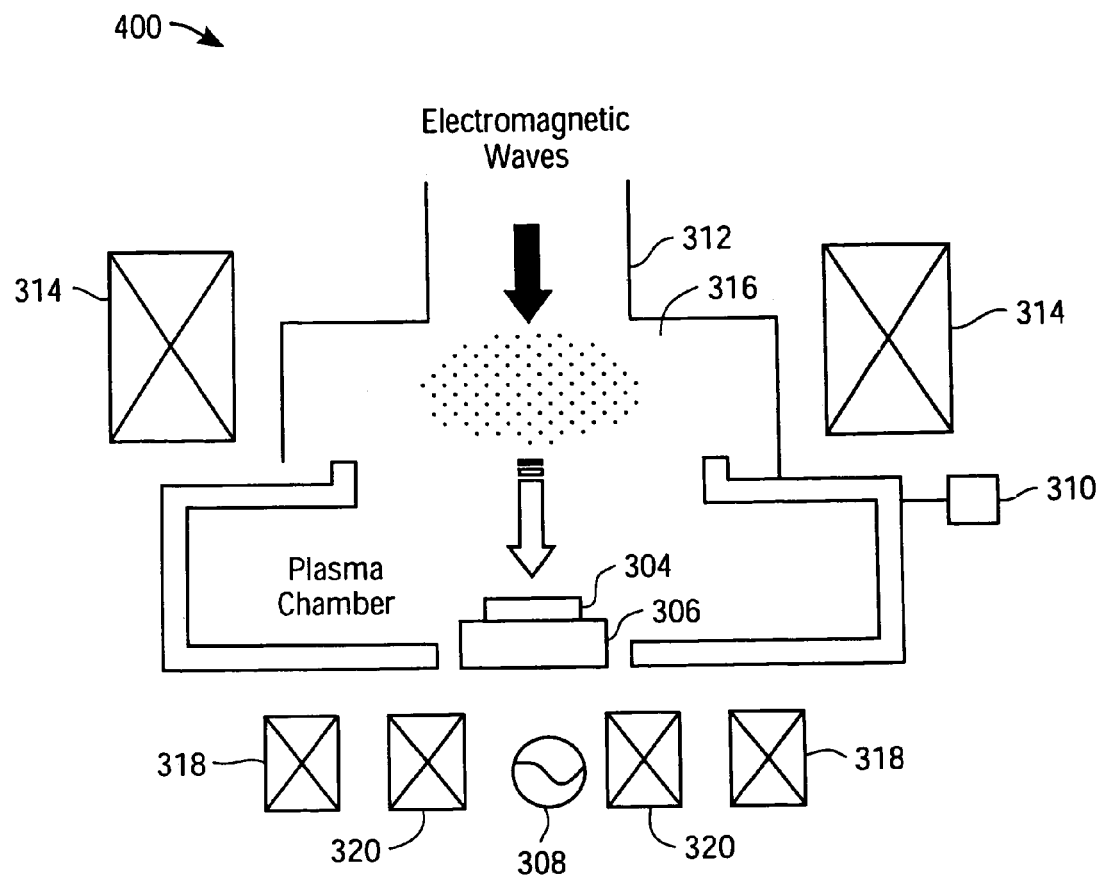
Figure 5:
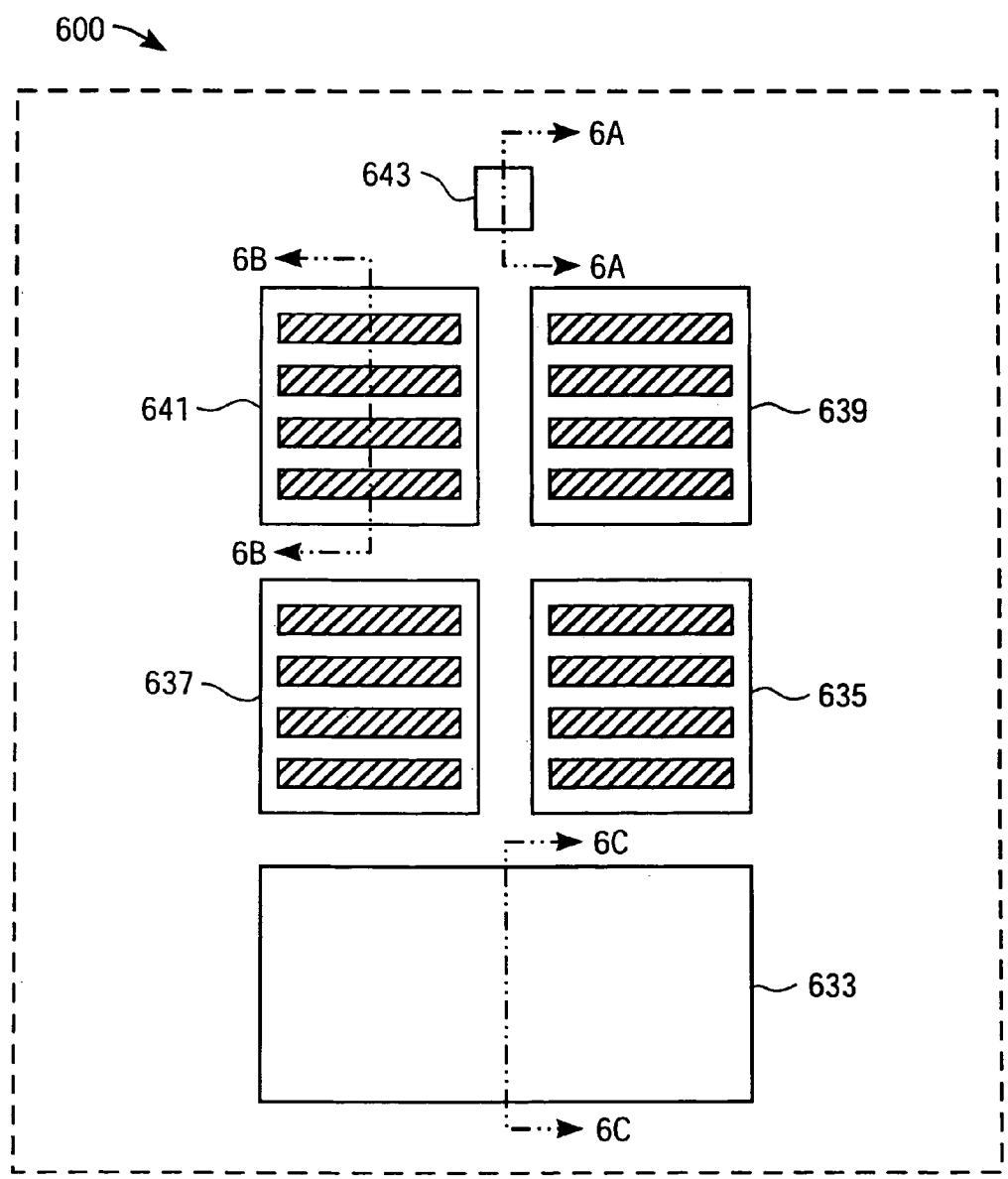
Figure 6A:
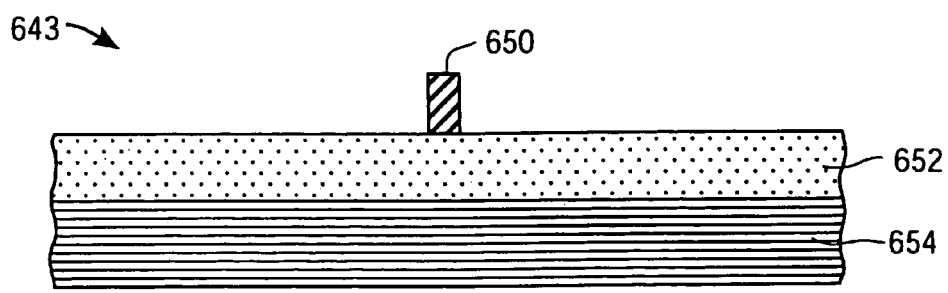
Figure 6B:
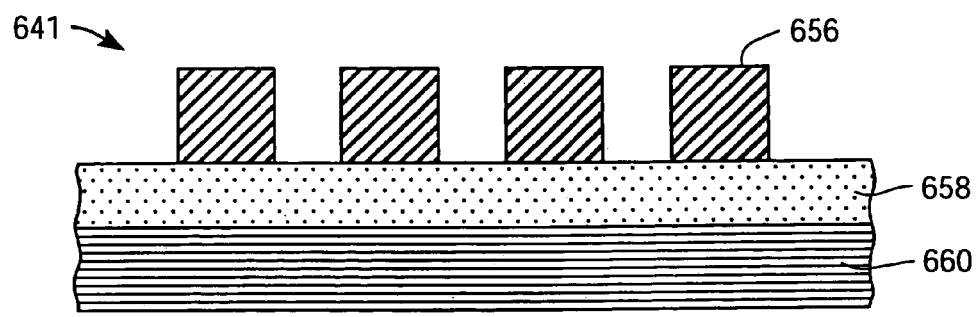
Figure 6C:
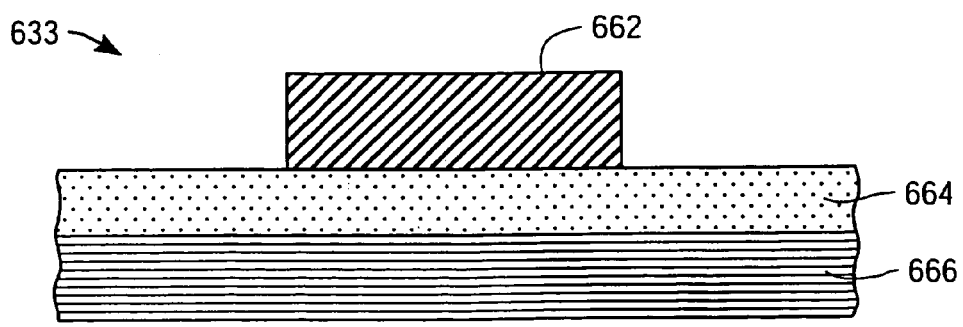

Prior Art FIGS. 2(A–B) schematically illustrates a Langmuir probe and the probe's current-voltage characteristic in a prior art;

FIG. 3 schematically illustrates a plasma chamber with a planar Langmuir probe, in accordance with an embodiment of the present invention;

FIG. 4 is a schematic illustration of a chemical vapor deposition apparatus, in accordance with an embodiment of the present invention;

FIG. 5 is an illustration of the wafer with planar plasma probe assembly array, in accordance with an embodiment of the present invention; and FIGS. 6(A–C) is a schematic illustration of a plasma probe assembly, in accordance with an embodiment of the present invention.

DETAILED DESCRIPTION OF THE PREFERRED EMBODIMENTS

An invention is disclosed for simultaneous measurement of shading induced potentials, ion fluxes, ion energy distribution, and the electron part of the I-V Langmuir probe characteristic. The present invention makes it possible to simultaneously measure several plasma characteristics in real time across a wide area of the wafer surface while the semiconductor wafer is inside of the plasma chamber. In the following description, numerous specific details are set forth in order to provide a thorough understanding of the present invention. It will be apparent, however, to one skilled in the art, that the present invention may be practiced without some or all of these specific details. In other instances, well known process steps have not been described in detail to avoid obscuring the present invention unnecessarily.

Figure 1A:
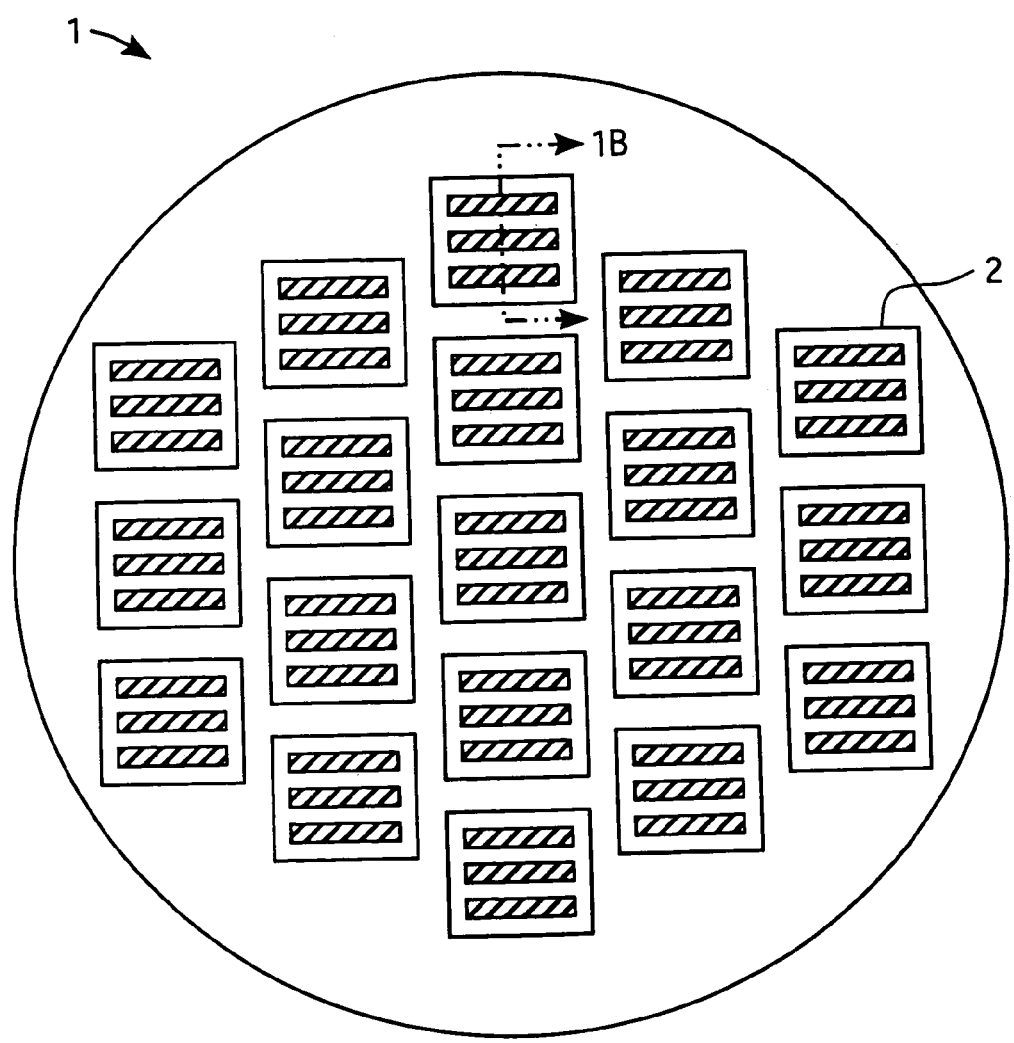

FIGS. 1 and 2 were described in terms of the prior art. FIG. 3 is an illustration of a planar Langmuir probe 300 in accordance with one embodiment of the present invention. In this embodiment, the present invention makes use of a "Planar Langmuir Probe". The Planar Langmuir Probe 300 includes an enclosure 302, a disc shaped electrode 304 on a wafer support 306. The disc shaped electrode 304 is positioned next to the wall of the enclosure 302. Preferably, the disc shaped electrode 304 has a relatively large surface area S (for example, a few square cm). The electrode 304 further includes a rear surface directed to the wall coated with an insulating material. The forward contact of the Langmuir probe is a conductor, and when placed in direct contact with moving charged particles found in plasma, a current is created through the wiring in the Langmuir probe. The apparatus of FIG. 3. is specifically for diagnostics of the plasma and so the enclosure 302 is preferably a vacuum enclosure that is filled with low pressure gas, such as Argon. Applying a bias voltage to the wafer support 306 generates plasma. To increase the ion impact power on the surface of the sample placed on the electrode 304, a radio frequency (RF) generator 308 is connected to the wafer support 306. An analyzer 310 connected to the plasma support measures the voltage across the disc shaped electrode 304.

While in the Langmuir probe method, a cylindrical probe made of conductor is placed in the plasma and the current is measured when a voltage is applied between the probe and the enclosure walls. In the present invention, a planar Langmuir probe made from low impedance N-type Silicon is employed to determine the plasma characteristics. The source for plasma could be d.c. voltage source, an electrode supplied by a radio frequency generator, an inductive coupling radio frequency source or a microwave source. The purpose of the RF Generator is to increase the ion impact power on the surface of the processing wafer when the plasma is impinging inside the plasma chamber. FIG. 4 is an illustration of a plasma processing system such as a high density plasma induced chemical vapor deposition process system 400 where the interactions of the plasma with the wafer is done from inside the processing chamber. In such a system, the plasma probes are embedded on the wafer itself and characteristics of the plasma are determined since the same plasma would interact with wafers during deposition or etching as applicable. The process system 400 includes a substrate 304 positioned on a chuck or a wafer support system 306, a turbo molecular pump 310, a wave guide 312, large magnets 314 surrounding a source chamber 316, outer magnets 318, and inner magnets 320.

In operation, the substrate 304 rests on the chuck 306 disposed inside a plasma chamber and biased by a RF generator 308. The chuck may be either an electrostatic chuck or a mechanical chuck and may be biased by a RF generator 308. A turbo molecular pump 310 controls the flow of hydrogen inside the plasma chamber. A wave guide 312 brings microwave inside source chamber 316, which is located above the plasma chamber. Large magnets 314 surrounding the source chamber generate a magnetic field that sets up a resonance zone inside the source chamber, where the electrons gyrate at the frequency of the incoming electromagnetic wave or microwave. As a result, a plasma is generated and spreads into the plasma chamber and onto the substrate 304. Outer magnets 318 and inner magnets 320 are used to fine focus this plasma.

Figure 2B:
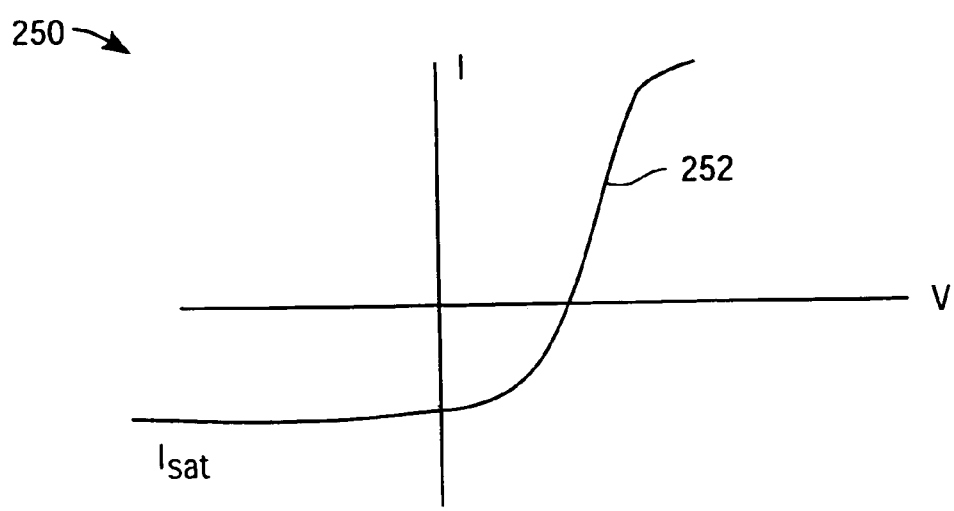

In order to perform diagnostics in the plasma chamber of a chemical vapor deposition system 400, the wafer containing the planar array of probes is introduced into the chamber. Plasma is generated in a way similar to what is described above. The forward contact of the Langmuir probes is a conductor, and when placed in direct contact with moving charged particles found in plasma, a current is created through the wiring in the Langmuir probe. The enclosure is preferably a vacuum enclosure that is filled with low pressure gas, such as Argon. Applying a bias voltage to the wafer chuck or wafer support 306 generates plasma. To increase the ion impact power on the surface of the sample placed on the electrode 304, a radio frequency (RF) generator 308 is connected to the wafer support 306. The plasma characteristic, such as, prior art FIG. 2B is obtained by varying the voltage on the probe and measuring the current when the probe is placed in the plasma. For large negative values of the probe potential, all electrons are essentially repelled and only ions contribute to current leading to an ion saturation current (Isat). This ion saturation current or Isat simply determines the electron density provided electron temperature can be determined. Conversely, Isat is also a product of electron charge, disk surface area and ion flow. For a more detailed account of measurement of electron and ion parametrics, one can refer to "Electric Probes for Plasma Diagnostics" by Swift and Schwar (1971) which is incorporated herein by reference in its entirety.

FIG. 5 is an illustration showing a planar plasma probe assembly array 600, in accordance with an embodiment of the present invention. The plasma probe assembly 600 in FIG. 5 includes six probe elements (633, 635, 637, 639, 641, and 643). Four of the six probe elements (635, 637, 639, and 641) are medium sized probe elements (FIG. 6B) suitable for patterning in different ways to diagnose potentials due to charge shading effects. The probe is usually on a substrate 660 on which there is probe having a layer of overcoat 658 and metal 656. The medium sized probe elements are roughly in the shape of a square but the shape itself is not so important.

Figure 1B:
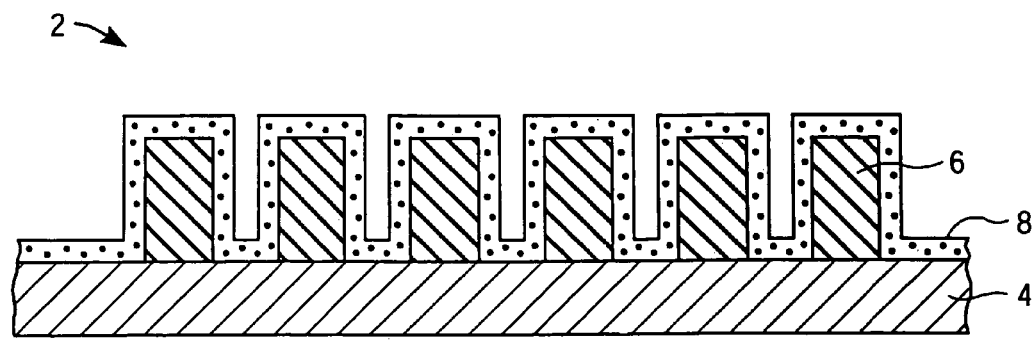
Figure 1C:
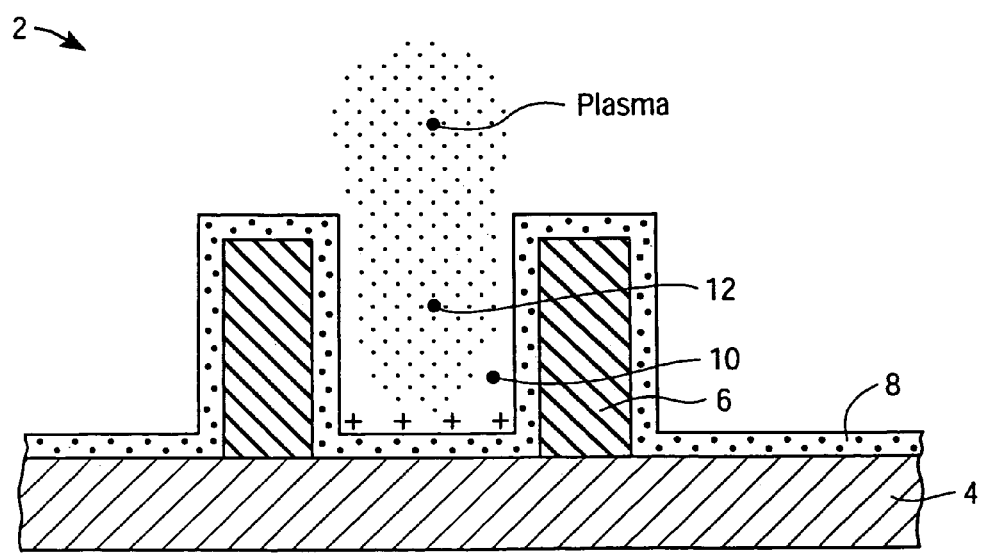

As in prior art shown in FIG. 1B, the probe elements with patterning include structures 2 that are integrated with a non-zero aspect ratio. The difference in the isotropy of electron and ion currents crossing the plasma sheath to closely spaced probe structures on the wafer substrate causes differential charging. Presence of comb-like structures causes shaded regions 10 (Prior art FIG. 1C) where there is charge accumulation and unshaded regions 12 (Prior art FIG. 1C) where there is no charge accumulation. If the plasma is not uniform across the substrate, then the resulting current imbalance causes a voltage to build up in the substrate. This is understood in the prior art to be the source of charge induced damage. The medium sized probe elements (635, 637,639, and 641 in FIG. 6B) in the invention, essentially, determine the charge uniformity of the plasma at the bottom of the structures in the processing chamber. The fifth probe element 633 (FIG. 6C) has an area equal to the four medium sized probe elements (635, 637, 639, and 641 in FIG. 6A) and constitutes a large probe element that is exposed to the plasma for floating potential and saturated ion flux measurements. The fifth probe element consists of a substrate 666 coated with a layer of overcoat 664 on which is a metal conductor 662. The fifth probe element is plain meaning it doesn't have patterning on it. That constitutes an aspect ratio of zero for plain probe elements. The sixth probe element 643 is a small probe, but with an area of the probe element about 1% the probe element area of all the six elements combined. The sixth probe element 643 is capable of providing electron measurements. The sixth probe element is on a wafer substrate 654 with a layer of overcoat 652 on which is the conductor element 650 which acts as a probe. The sixth probe element has no patterning of structures and has an aspect ratio of zero.

From the above it will be appreciated that the described embodiments provide a plasma diagnostic tool capable of simultaneously measuring six different plasma characteristics on a large wafer area.

While the invention has been described in terms of preferred embodiments, other embodiments, including alternatives, modifications, permutations and equivalents of the embodiments described herein, will be apparent to those skilled in the art from consideration of the specification, study of the Figures, and practice of the disclosed embodiments. Therefore, the embodiments and preferred features described above should be considered exemplary, with the invention being defined by the appended claims, which therefore include all such alternatives, modifications, permutations and equivalents as fall within the true spirit and scope of the present invention.

What is claimed is:

1. A wafer integrated plasma probe assembly array comprising:
 a plurality of plasma probes; the plurality of plasma probes comprising:
  a larger sized probe;
  four medium sized probes; and
  a smaller sized probe;
 wherein the larger sized probe has a geometrical area equal to the geometric area of the four medium sized probes; and
 the smaller probe has an area which is very much smaller than any of the larger and medium sized probes.

2. A wafer integrated plasma probe assembly array as in claim 1 wherein all of the plasma probes are Langmuir probes made from low impedance N-type Silicon.

3. A wafer integrated plasma probe assembly array as in claim 1, the plurality of plasma probes further comprising the larger sized probe and the smaller sized probe being plain probes.

4. A wafer integrated plasma probe assembly array as in claim 1, the plurality of plasma probes further comprising the four medium sized probes being patterned probes.

5. A wafer integrated plasma probe assembly array of claim 1, wherein the smaller sized probe has a geometrical area of about 0.25 mm squared.

6. A wafer integrated plasma probe assembly array as in claim 4, wherein the patterning on the four medium sized probes constitutes four different aspect ratios.

7. A wafer integrated plasma probe assembly array as in claim 1, wherein the smaller sized probe has a probe element area of about one (1%) percent of the geometrical area of all the larger sized probe and the four medium sized probes and the smaller sized probe combined.

8. A wafer integrated plasma probe assembly array comprising:
 a plurality of plasma probes; the plurality of plasma probes comprising:
  a larger sized probe having a probe element area;
  four medium sized probes each having a probe element area; and
  a smaller sized probe having a probe element area;

wherein the probe element area of the larger sized probe is about equal to the combined probe element area of the four medium sized probes; and the probe element area of the smaller probe is very much smaller than the probe element area any of the larger and medium sized probes.

9. A wafer integrated plasma probe assembly array as in claim 8, wherein the probe element area of the smaller sized probe is about 0.25 mm squared.

10. A wafer integrated plasma probe assembly array as in claim 8, wherein the probe element area of the smaller sized probe is about one (1%) percent of the respective probe element area of all the larger sized probe and the four medium sized probes and the smaller sized probe combined.

11. A wafer integrated plasma probe assembly array as in claim 9 wherein all of the plasma probes are Langmuir probes made from low impedance N-type Silicon.

12. A wafer integrated plasma probe assembly array as in claim 10, wherein all of the plasma probes are Langmuir probes made from low impedance N-type Silicon.

13. A wafer integrated plasma probe assembly array as in claim 9, the plurality of plasma probes further comprising the larger sized probe and the smaller sized probe being plain probes.

14. A wafer integrated plasma probe assembly array as in claim 10, the plurality of plasma probes further comprising the larger sized probe and the smaller sized probe being plain probes.

15. A wafer integrated plasma probe assembly array as in claim 9, the plurality of plasma probes further comprising the four medium sized probes being patterned probes.

16. A wafer integrated plasma probe assembly array as in claim 10, the plurality of plasma probes further comprising the four medium sized probes being patterned probes.

17. A wafer integrated plasma probe assembly array comprising:

a plurality of plasma probes; the plurality of plasma probes comprising:

a larger sized probe;

four medium sized probes; and a smaller sized probe;

wherein the larger sized probe has a probe element area equal to the probe element area of the four medium sized probes;

wherein the smaller sized probe has a probe element area of about one (1%) percent of the probe element area of all the larger sized probe and the four medium sized probes and the smaller sized probe combined.

18. A wafer integrated plasma probe assembly array as in claim 17 wherein all of the plasma probes are Langmuir probes made from low impedance N-type Silicon.

19. A wafer integrated plasma probe assembly array as in claim 17, the plurality of plasma probes further comprising the four medium sized probes being patterned probes.

20. A wafer integrated plasma probe assembly array as in claim 17, the plurality of plasma probes further comprising the larger sized probe and the smaller sized probe being plain probes.

* * * * *